United States Patent
Won et al.

(10) Patent No.: US 8,786,323 B2
(45) Date of Patent: Jul. 22, 2014

(54) DRIVER WITH RESISTANCE CALIBRATION CAPABILITY

(71) Applicant: Samsung Electronics Co., Ltd., Suwon-si (KR)

(72) Inventors: Min-Ho Won, Seoul (KR); Sang-Hune Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/835,495

(22) Filed: Mar. 15, 2013

(65) Prior Publication Data

US 2013/0257491 A1 Oct. 3, 2013

(30) Foreign Application Priority Data

Apr. 3, 2012 (KR) .................. 10-2012-0034581

(51) Int. Cl.
- *H03B 1/00* (2006.01)
- *H03K 3/00* (2006.01)
- *H03F 3/45* (2006.01)

(52) U.S. Cl.
CPC ..................................... *H03F 3/45* (2013.01)
USPC ........... 327/108; 327/109; 327/110; 327/112; 326/30

(58) Field of Classification Search
CPC ........ H03F 3/45; H03F 3/45071; G11C 7/062
USPC ..................... 327/108, 109; 326/30
See application file for complete search history.

(56) References Cited

U.S. PATENT DOCUMENTS

| | | |
|---|---|---|
| 6,292,014 B1 | 9/2001 | Hedberg |
| 6,674,313 B2 | 1/2004 | Kurisu et al. |
| 6,704,818 B1 | 3/2004 | Martin et al. |
| 6,940,685 B2 | 9/2005 | Chrappan Soldavini et al. |
| 7,071,739 B1 * | 7/2006 | Duzevik et al. ............. 327/108 |
| 7,215,144 B2 | 5/2007 | Mitby et al. |
| 7,227,382 B1 | 6/2007 | Talbot et al. |
| 7,307,447 B2 | 12/2007 | Clements et al. |
| 7,315,186 B2 | 1/2008 | Martin et al. |
| 7,501,851 B2 | 3/2009 | Venditti et al. |
| 7,733,128 B2 | 6/2010 | Miura |
| 7,821,290 B2 | 10/2010 | Thomsen |
| 7,834,654 B2 * | 11/2010 | Millar ............................. 326/30 |

FOREIGN PATENT DOCUMENTS

| | | |
|---|---|---|
| JP | 2005-217999 A | 8/2005 |
| KR | 10-1045071 B1 | 6/2011 |

* cited by examiner

*Primary Examiner* — John Poos
(74) *Attorney, Agent, or Firm* — Myers Bigel Sibley & Sajovec, P.A.

(57) ABSTRACT

A semiconductor device includes a driver circuit having an output resistance that is controllable responsive to a resistance control signal and a calibration circuit configured to duplicate a resistance behavior of the driver circuit and to generate the resistance control signal responsive to the duplicated resistance behavior. The driver circuit may include a first variable resistor and may be configured to couple an output node to a power supply node via the first variable resistor responsive to an input signal The calibration circuit may include a second variable resistor that is a duplicate of the first variable resistor. The calibration circuit may further include a current source circuit and may be configured to couple the second variable resistor between the power supply node and the current source circuit and to generate the resistance control signal responsive to a voltage of the second variable resistor.

16 Claims, 9 Drawing Sheets

DRIVER WITH RESISTANCE CALIBRATION CAPABILITY

CROSS-REFERENCE TO RELATED APPLICATIONS

This application claims the benefit of Korean Patent Application No. 10-2012-0034581, filed on Apr. 3, 2012, in the Korean Intellectual Property Office, the disclosure of which is incorporated herein in its entirety by reference.

BACKGROUND

The inventive subject matter relates to semiconductor devices and, more particularly, to driver circuits for semiconductor devices.

To meet demands for increased data transmission rates for devices such as universal serial bus (USB) semiconductor memory devices, devices having a data transmission rate equal to or above 1 Gbps have been recently developed. As such high speed transmitting devices are miniaturized, power consumption of a resistor of a channel connecting a transmitter and a receiver and at a source termination resistor of the transmitter need to be reduced.

SUMMARY

Some embodiments of the inventive subject matter provide a semiconductor including a driver circuit including a first variable resistor and having a resistance configured to be adjusted responsive to a resistance control signal and a first switch, connected in series with the first variable resistor and configured to couple an output node to a power supply node via the first variable resistor responsive to an input signal. The device further includes a second variable resistor and a control circuit configured to generate a voltage across the second variable resistor and to generate the resistance control signal responsive to the generated voltage. The second variable resistor may be a duplicate of the first variable resistor. The first and second variable resistors may be disposed on a common substrate.

In some embodiments, the control circuit may include a current source circuit, a second switch coupled in series with the second variable resistor and configured to couple the current source circuit to a power supply node via the second variable resistor and a digital code generation circuit configured to sense a voltage at a terminal of the second switch and to generate a digital code signal responsive to the sensed voltage. The second variable resistor may be a duplicate of the first variable resistor and wherein the second switch may be a duplicate of the first switch. The first variable resistor, the first switch, the second variable resistor and the second switch may be disposed on a common substrate. The current source circuit may include a current mirror circuit.

In some embodiments, the digital code generation circuit may be configured to adjust the second variable resistor to cause the sensed voltage at the terminal of the second switch to meet a predetermined criterion and to generate the digital code signal based responsive to adjustment of the second variable resistor. The control circuit may be configured to open the second switch to prevent current flow through the second variable resistor responsive to generation of the digital code signal.

In further embodiments, the first variable resistor may include a fixed resistor and a resistance control circuit coupled in parallel with the fixed resistor and adjustable responsive to the resistance control signal. The resistance control circuit may include a plurality of resistors and a switching circuit configured to selectively couple the plurality of resistors in parallel with the fixed resistor responsive to the resistance control signal.

Further embodiments of the inventive subject matter provide a semiconductor device including a driver circuit including a first variable resistor having a resistance configured to be adjusted responsive to a first resistance control signal, a first switch connected in series with the first variable resistor and configured to couple an output node to a first power supply node via the first variable resistor responsive to an input signal, a second variable resistor having a resistance configured to be adjusted responsive to a second resistance control signal, and a second switch connected in series with the second variable resistor and configured to couple the output node to a second power supply node via the second variable resistor responsive to the input signal. The device further includes a calibration circuit including a third variable resistor that is a duplicate of the first variable resistor, a fourth variable resistor that is a duplicate of the second variable resistor and a control circuit configured to generate respective ones of the first and second resistance control signals responsive to voltages across respective ones of the third and fourth variable resistors.

Still further embodiments provide a semiconductor device including a driver circuit having an output resistance that is controllable responsive to a resistance control signal and a calibration circuit configured to duplicate a resistance behavior of the driver circuit and to generate the resistance control signal responsive to the duplicated resistance behavior. The driver circuit may include a first variable resistor and may be configured to couple an output node to a power supply node via the first variable resistor responsive to an input signal The calibration circuit may include a second variable resistor that is a duplicate of the first variable resistor. The calibration circuit may further include a current source circuit and may be configured to couple the second variable resistor between the power supply node and the current source circuit and to generate the resistance control signal responsive to a voltage of the second variable resistor.

The driver circuit may include a first switch configured to couple the first variable resistor between the power supply node and the output node. The calibration circuit may include a second switch that is a duplicate of the first switch and that is configured to couple the second variable resistor between the power supply node and the current source circuit. The calibration circuit may be configured to generate the resistance control signal responsive to a voltage at a terminal of the second switch. The first variable resistor may include a fixed resistor, a plurality of resistors and a switching circuit configured to selectively couple the plurality of resistors in parallel with the fixed resistor responsive to the resistance control signal.

BRIEF DESCRIPTION OF THE DRAWINGS

Exemplary embodiments of the inventive subject matter will be more clearly understood from the following detailed description taken in conjunction with the accompanying drawings in which.

DETAILED DESCRIPTION

Figure 1:
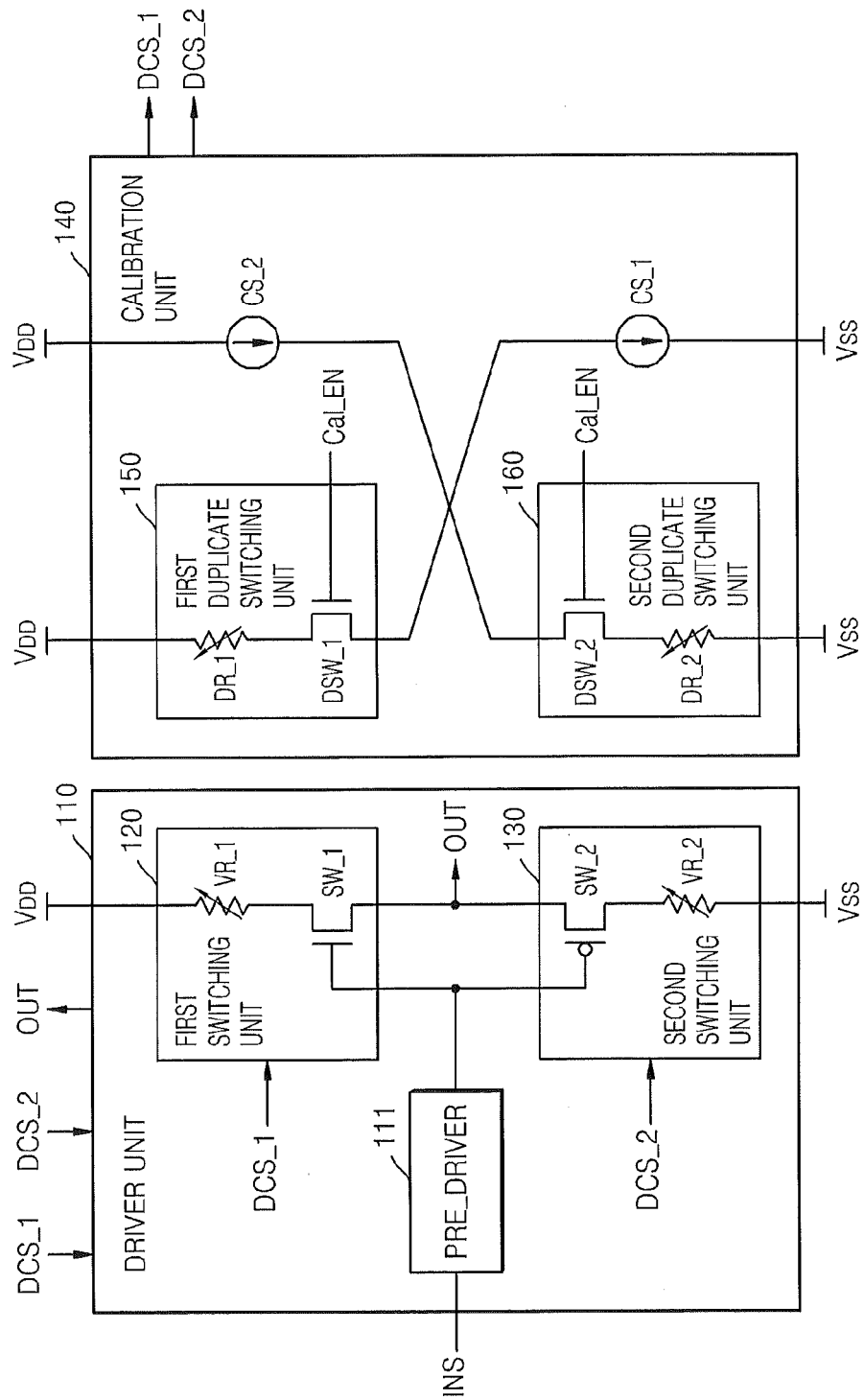
FIG. 1 is a circuit diagram of a driver circuit according to some embodiments of the inventive subject matter.

The attached drawings for illustrating exemplary embodiments of the inventive subject matter are referred to in order to gain a sufficient understanding of the exemplary embodiments, the merits thereof, and the objectives accomplished by the implementation of the exemplary embodiments. Hereinafter, the exemplary embodiments will be described in detail with reference to the attached drawings. Like reference numerals in the drawings denote like elements, and sizes of elements may be enlarged or reduced for clarity.

The terms used in the present specification are merely used to describe particular embodiments, and are not intended to limit the inventive subject matter. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, a first element may be named as a second element and a second element may be named as a first element without deviating from the range of the inventive subject matter.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a high-speed voltage mode driver 100 according to some embodiments of the inventive subject matter.

Referring to FIG. 1, the high-speed voltage mode driver circuit 100 includes a driver unit 110 and a calibration unit 140. The driver unit 110 may include a pre-driver 111, a first switching unit 120, and a second switching unit 130. The first switching unit 120 may include a first variable resistor VR_1 and a first switch SW_1. The second switching unit 130 may include a second variable resistor VR_2 and a second switch SW_2.

When an input signal INS is input to the pre-driver 111, the pre-driver 111 may amplify the input signal INS. The pre-driver 111 may gradually amplify the input signal INS by using a plurality of transistors. The amplified input signal INS may complementarily switch the first and second switches SW_1 and SW_2.

For example, when the input signal INS is high, the first switch SW_1 may be turned on and the second switch SW_2 may be turned off. In this case, a voltage (for example, a high voltage) supplied by a power source VDD may be output through an output terminal OUT. Alternatively, when the amplified input signal INS is low, the first switch SW_1 may be turned off and the second switch SW_2 may be turned on. In this case, a voltage (for example, a low voltage) supplied by a power source VSS may be output through the output terminal OUT. A signal output through the output terminal OUT may be transmitted to a receiver through a channel.

The first and second variable resistors VR_1 and VR_2 may be adjusted according to a resistance value of the channel, thereby reducing power consumption. For example, when resistance values of the first and second switching units 120 and 130 are same as the resistance value of the channel, power consumption may be reduced. Accordingly, the resistance value of the first variable resistor VR_1 may be precisely calibrated.

The driver unit 110 according to some embodiments may receive a first digital code signal DCS_1 generated by the calibration unit 140 to adjust a size of the resistance value of the first variable resistor VR_1 of the first switching unit 120. Also, the driver unit 110 according to some embodiments may receive a second digital code signal DCS_2 generated by the calibration unit 140 to adjust a size of the resistance value of the second variable resistor VR_2 of the second switching unit 130.

The calibration unit 140 may include a first duplicate switching unit 150 and a second duplicate switching unit 160. The first duplicate switching unit 150 may include a first duplicate variable resistor DR_1 and a first duplicate switch DSW_1. The first duplicate switching unit 150 may be connected to a first current source CS_1 in series. The second duplicate switching unit 160 may include a second duplicate variable resistor DR_2 and a second duplicate switch DSW_2. The second duplicate switching unit 160 may be connected to a second current source CS_2 in series.

The first current source CS_1 may maintain a current flow through the first duplicate variable resistor DR_1 of the first duplicate switching unit 150. A resistance value of the first duplicate variable resistor DR_1 may be adjusted such that a size of a voltage drop of the first duplicate switching unit 150 is within a predetermined range. The first switching unit 120 and the first duplicate switching unit 150 according to some embodiments are identically configured. For example, the first switching unit 120 and the first duplicate switching unit 150 may be adjacently disposed on one substrate, and may have the same dimension and may be formed under the same conditions. Accordingly, the first switching unit 120 and the first duplicate switching unit 150 may have substantially no difference in physical properties that are generated during processes or due to environmental changes.

The high-speed voltage mode driver 100 according to some embodiments may transmit a first digital code generated according to the adjusted resistance value of the first duplicate variable resistor DR_1 to the first switching unit 120. When the driver unit 110 adjusts the resistance value of the first variable resistor VR_1 through the first digital code, power consumption generated according to the resistance value of the channel may be reduced.

The first digital code may be stored in a buffer by digitally changing the resistance value of the first duplicate variable resistor DR_1. When the first duplicate switch DSW_1 is turned off after storing the first digital code in the buffer, power consumption by the first current source CS_1 may be reduced.

The second duplicate switching unit 160 may operate in a similar manner. In other words, the second switching unit 130 and the second duplicate switching unit 160 may be adjacently disposed on one substrate, such that variations of physical properties generated during processes or due to environmental changes are substantially the same. Accordingly, power consumption generated according to the resistance value of the channel may be reduced by adjusting the resistance value highlight C of the second variable resistor VR_2 by transmitting a second digital code indicating the resistance value of the second duplicate variable resistor DR_2 to the second switching unit 130. The second digital code may be stored in the buffer.

Operations of the high-speed voltage mode driver 100 according to some embodiments of the inventive subject matter will now be described.

The first current source CS_1 enables a constant current to flow through the first duplicate switching unit 150. Accordingly, a voltage difference is generated between two terminals of the first duplicate switching unit 150 by a resistance value of the first duplicate switching unit 150 (a sum of the resistance value of the first duplicate variable resistor DR_1 and the resistance value of the first duplicate switch DSW_1). A resistance value of the first duplicate variable resistor DR_1 may be adjusted so as to adjust the resistance value of the first duplicate switching unit 150. A desired voltage difference Vd may be generated between the two terminals of the first duplicate switching unit 150 by adjusting the resistance value of the first duplicate variable resistor DR_1. The desired voltage difference Vd at the two terminals of the first duplicate switching unit 150 may differ based on the resistance value of the channel through which an output signal of the high-speed voltage mode driver 100 is transmitted, environmental factors, or process factors. Since the high-speed voltage mode driver 100 according to some embodiments digitally adjusts the resistance value of the first duplicate variable resistor DR_1, the voltage difference applied to the first duplicate switching unit 150 may be discretely adjusted. In this case, the calibration unit 140 may generate the first digital code corresponding to the adjusted resistance value of the first duplicate variable resistor DR_1.

The calibration unit 140 may generate the first digital code signal DCS_1 according to the first digital code. The driver unit 110 may adjust the resistance value of the first variable resistor VR_1 based on the received first digital code signal DCS_1. Similarly, the driver unit 110 may adjust the resistance value of the second variable resistor VR_2 based on the received second digital code signal DCS_2. Accordingly, the high-speed voltage mode driver 100 according to some embodiments may have reduced power consumption by adjusting the resistance value of the channel.

Figure 2A:
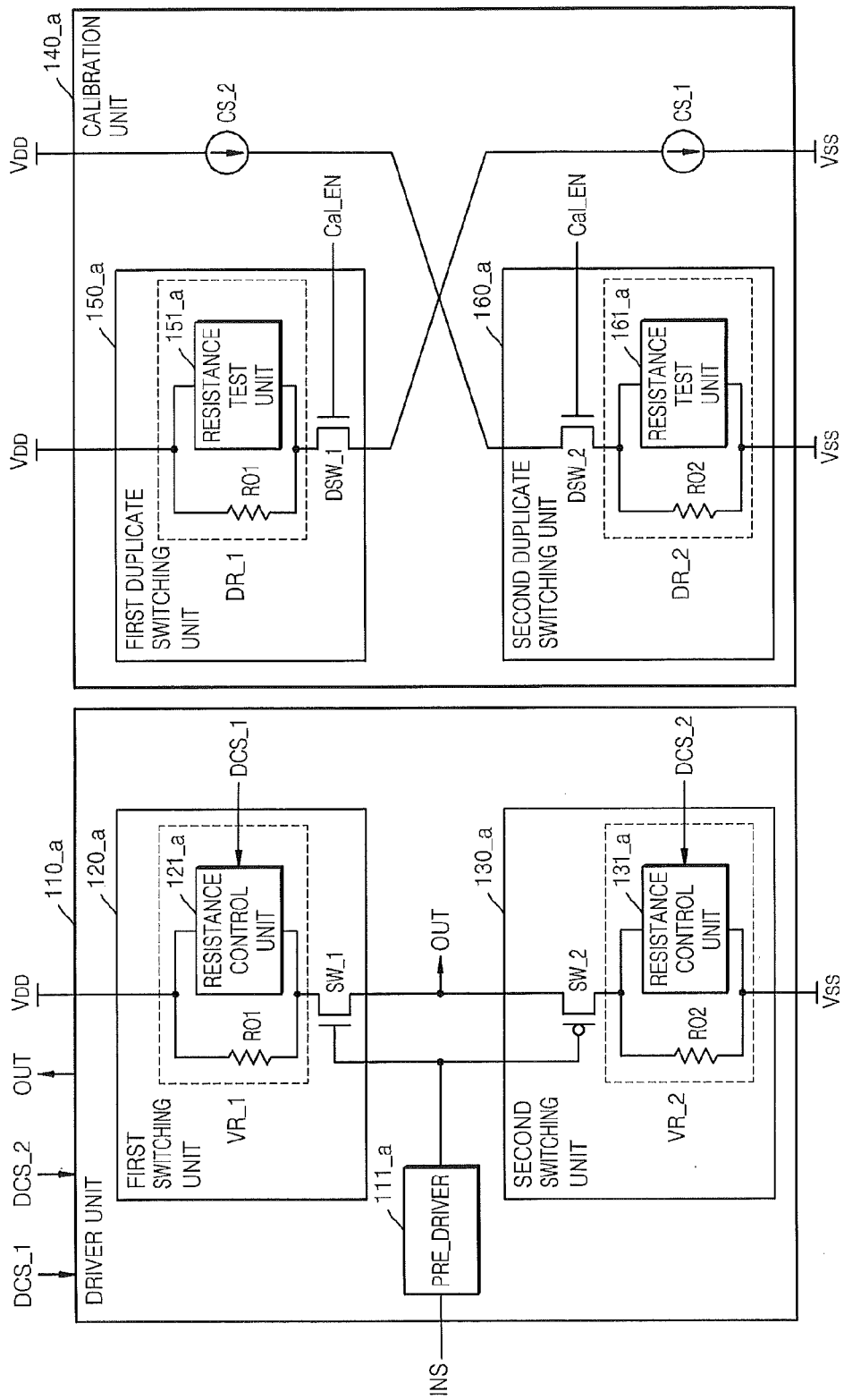
FIG. 2A is a detailed circuit diagram of a driver circuit according to some embodiments of the inventive subject matter.

FIG. 2A is a detailed circuit diagram of a high-speed voltage mode driver 100_a according to some embodiments of the inventive subject matter.

Referring to FIG. 2A, the high-speed voltage mode driver 100_a includes a driver unit 110_a and a calibration unit 140_a. The driver unit 110_a may include a pre-driver 111_a, a first switching unit 120_a, and a second switching unit 130_a. The pre-driver 111_a of the driver unit 110_a may operate in a manner similar to the pre-driver 111 of the driver unit 110 of FIG. 1.

The first switching unit 120_a may include a first variable resistor VR_1 and a first switch SW_1. The first variable resistor VR_1 may include a fixed resistor R01 and a resistance control unit 121_a. The second switching unit 130_a may include a second variable resistor VR_2 and a second switch SW_2. The second variable resistor VR_2 may include a fixed resistor R02 and a resistance control unit 131_a. Repeated descriptions of elements described with reference to FIG. 1 are not provided.

The first variable resistor VR_1 of the first switching unit 120_a may include the fixed resistor R01 and the resistance control unit 121_a. According to further embodiments, the resistance control unit 121_a may be connected to the fixed resistor R01 in series. The resistance control unit 121_a may control a size of a resistance value of the first variable resistor VR_1 based on a received first digital code signal DCS_1. Similarly, the resistance control unit 131_a may control a size of a resistance value of the second variable resistor VR_2 based on a received second digital code signal DCS_2.

A first duplicate variable resistor DR_1 of a first duplicate switching unit 150_a may include a first duplicate variable resistor DR_1, a fixed resistor R01, and a resistance test unit 151_a. The resistance test unit 151_a may be adjusted to provide a predetermined voltage between two terminals of the first duplicate switching unit 150_a. A detailed description of operations for such adjustment is described below with reference to FIGS. 3A through 3C. The calibration unit 140_a may generate the first digital code signal DCS_1 according to the adjusted resistance test unit 151_a. The calibration unit 140_a may generate the second digital code signal DCS_2 in a manner similar to the first digital code signal DCS_1.

Figure 2B:
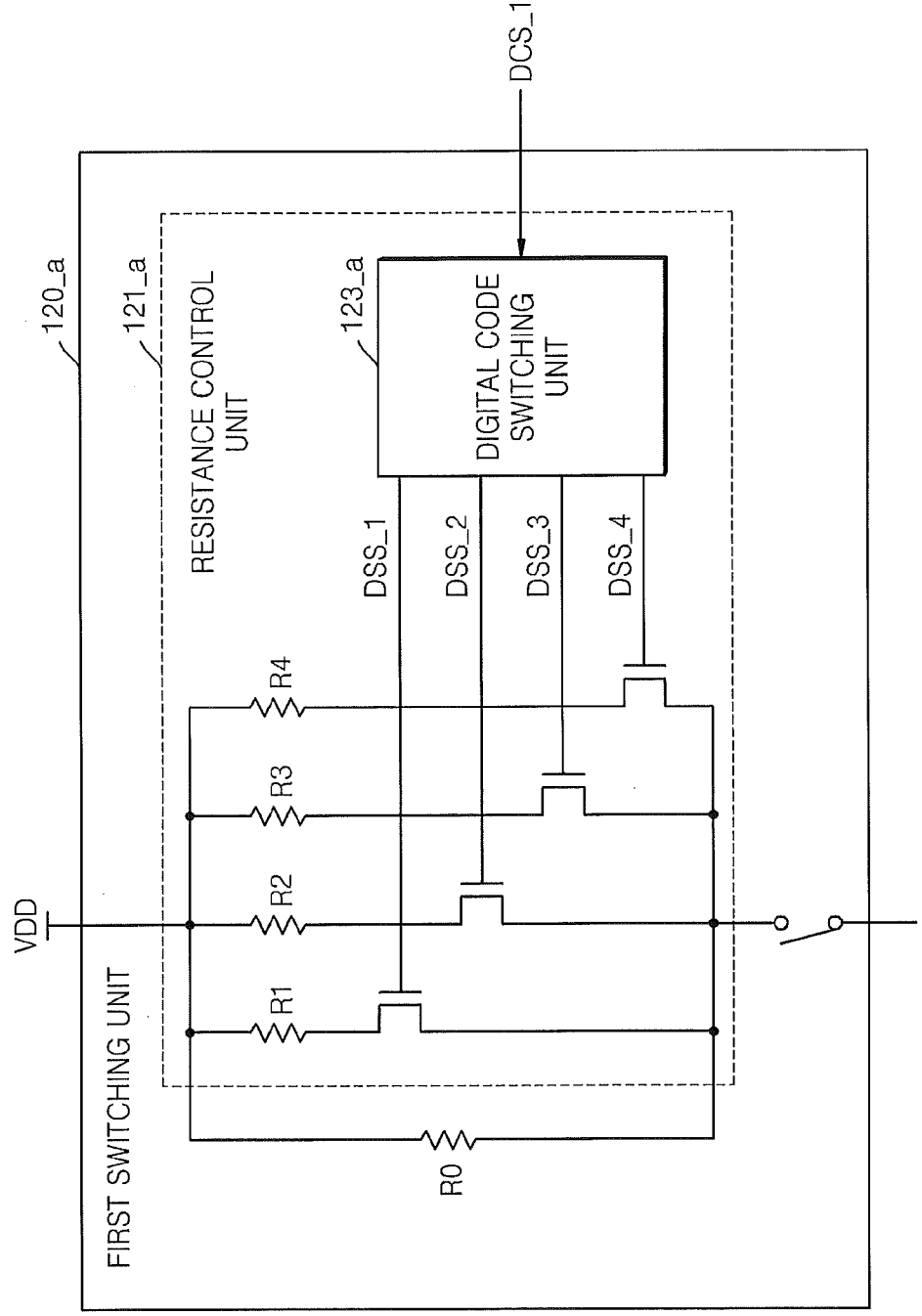
FIG. 2B is a circuit diagram illustrating a first switching unit of the driver circuit of FIG. 2A according to some embodiments of the inventive subject matter.

FIG. 2B is a circuit diagram for describing in detail the first switching unit 120_a of the high-speed voltage mode driver 100_a of FIG. 2A, according to some embodiments of the inventive subject matter.

Referring to FIG. 2B, the first switching unit 120_a may include the resistance control unit 121_a. The resistance control unit 121_a may include a plurality of resistors R1 through R4 connected in parallel, and a digital code switching unit 123_a. The digital code switching unit 123_a may generate a first digital switching signal DSS_1, a second digital switching signal DSS_2, a third digital switching signal DSS_3, and a fourth digital switching signal DSS_4, based on the received first digital code signal DCS_1. It will be understood that the number of digital switching signals and the number of resistors connected in parallel are not limited to those exemplified herein. For example, the number of digital switching signals and the number of resistors connected in parallel may be 8, 16, or 24.

The resistor R1 may be connected in parallel with a fixed resistor R0 by the first digital switching signal DSS_1. The resistor R2 may be connected in parallel with the fixed resistor R0 by the second digital switching signal DSS_2. The resistor R3 may be connected in parallel with the fixed resistor R0 in parallel by the third digital switching signal DSS_3. The resistor R4 may be connected in parallel with the fixed resistor R0 by the fourth digital switching signal DSS_4. Accordingly, a resistance of the first variable resistor VR_1 may be determined based on the first through fourth digital switching signals DSS_1 through DSS_4. A resistance of the first switching unit 120_a may be adjusted based on the resistance value of the first variable resistor VR_1.

For example, when the first digital code switching signal DSS_1 is high and the second through fourth digital code switching signals DSS_2 through DSS_4 are low, the resistance value of the first variable resistor VR_1 may be the same as a resistance value when the fixed resistor R0 and the resistor R1 are connected in parallel, i.e., R0×R1/(R0+R1).

Figure 3A:
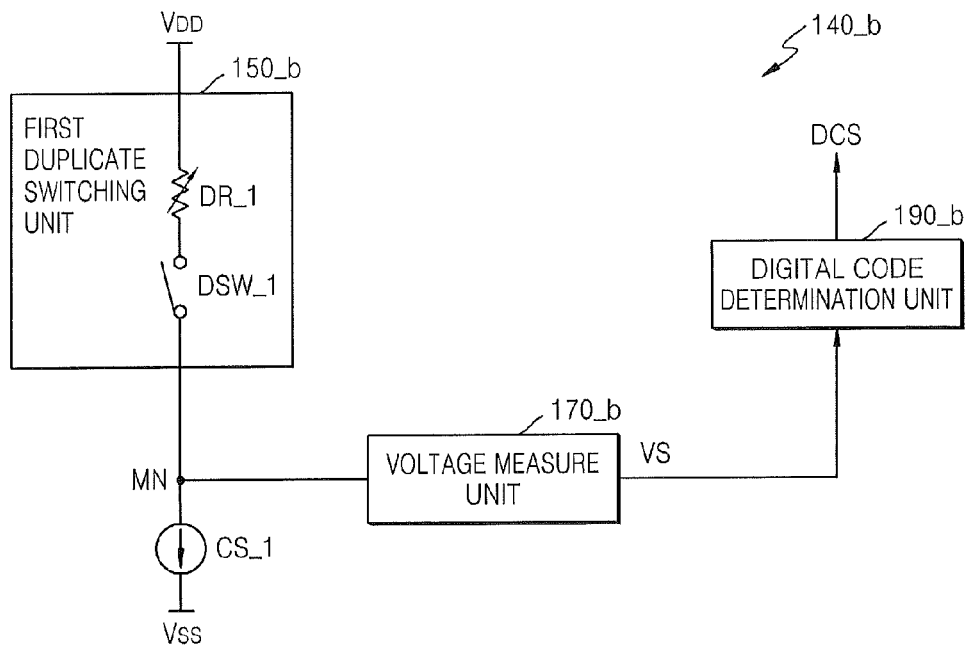
FIG. 3A is a circuit diagram illustrating a duplicate switching unit of a calibration unit of a driver circuit according to some embodiments of the inventive subject matter.

FIG. 3A is a circuit diagram illustrating in detail a structure of a first duplicate switching unit 150_b of a calibration unit 140_b of a high-speed voltage mode driver, according to some embodiments of the inventive subject matter. The calibration unit 140_b includes the first duplicate switching unit 150_b, a first current source CS_1, a voltage measure unit 170_b, and a digital code determination unit 190_b. The first duplicate switching unit 150_b and the first current source CS_1 of the calibration unit 140_b operate in a similar manner to the first duplicate switching unit 150 and the first current source CS_1 of the calibration unit 140 of FIG. 1, and thus repeated descriptions thereof are not provided.

The voltage measure unit 170_b measures a voltage of a terminal, hereinafter, referred to as a measuring node MN, of the first duplicate switching unit 150_b, which is not connected to a power source VDD, of two terminals of the first duplicate switching unit 150_b. The voltage measure unit 170_b may measure the voltage of the measuring node MN to generate a voltage signal VS corresponding to the voltage of the measuring node MN. The voltage measure unit 170_b may digitally (discretely) measure a voltage. For example, the voltage measure unit 170_b may measure a range of the voltage of the measuring node MN by using a plurality of comparators. The voltage measure unit 170_b may generate the voltage signal VS based on the range of the voltage of the measuring node MN.

The digital code determination unit 190_b may receive the voltage signal VS generated by the voltage measure unit 170_b. The digital code determination unit 190_b may determine a digital code through the voltage signal VS. For example, a size of a resistance value of the first duplicate switching unit 150_b may be calculated through an intermediate value of the range of the voltage of the measuring node MN through the voltage signal VS received from the voltage measure unit 170_b. For example, when the intermediate value of the range of the voltage of the measuring node MN is 1.4 V, a current supplied by a first current source CS_1 is 0.25 mA, and voltage supplied by the power source VDD is 1.5 V, a size of the resistance value of the first duplicate switching unit 150_b may be calculated to be 400Ω. If a resistance value of a channel is 50Ω, the resistance value of the first duplicate switching unit 150_b may be reduced from 400Ω to 50Ω. Referring to FIG. 2B, the resistance value of the first switching unit 120_a may be adjusted through the first through fourth digital switching signals DSS_1 through DSS_4. Accordingly, the digital code determination unit 190_b may determine a digital code for determining a connection of the fixed resistor R0 to other resistors, such as the resistors R1 through R4. The digital code determination unit 190_b may generate a digital code signal DCS based on the determined digital code.

Operations of the calibration unit 140_b will now be described in detail. When a first duplicate switch DSW_1 is closed by an external signal, for example, a calibration enable signal Cal_EN (See FIG. 1), the first duplicate switching unit 150_b conducts a constant current from the first current source CS_1. Accordingly, a voltage drop is generated by a resistance of the first duplicate switching unit 150_b. The voltage measure unit 170_b may measure the voltage of the measuring node MN to generate the voltage signal VS corresponding to the voltage of the measuring node MN. The digital code determination unit 190_b may receive the voltage signal VS generated by the voltage measure unit 170_b. The digital code determination unit 190_b may determine a digital code corresponding to the voltage signal VS. The digital code determination unit 190_b may generate the digital code signal DCS based on the determined digital code.

Figure 3B:
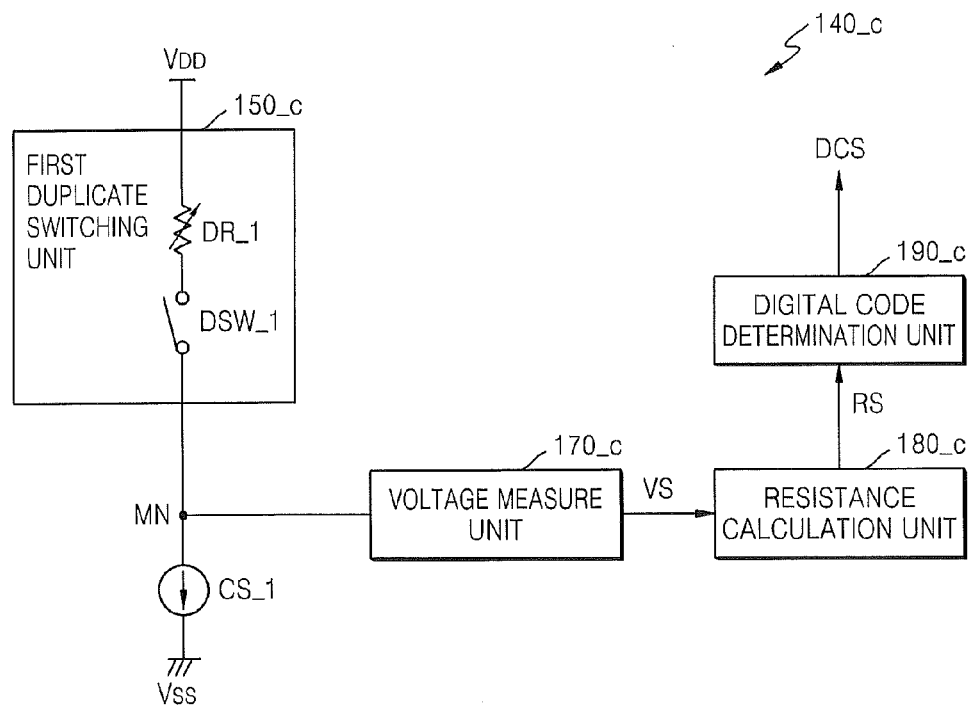
FIG. 3B is a circuit diagram illustrating a duplicate switching unit of a calibration unit of a driver circuit according to further embodiments of the inventive subject matter.

FIG. 3B is a circuit diagram illustrating in detail a structure of a first duplicate switching unit 150_c of a calibration unit 140_c of a high-speed voltage mode driver, according to further embodiments of the inventive subject matter. The calibration unit 140_c includes a first duplicate switching unit 150_c, a first current source CS_1, a voltage measure unit 170_c, a resistance calculation unit 180_c, and a digital code determination unit 190_c. The first duplicate switching unit 150_c, the first current source CS_1, the voltage measure unit 170_c, and the digital code determination unit 190_c of the calibration unit 140_c operate in a similar manner to the first duplicate switching unit 150_b, the first current source CS_1, the voltage measure unit 170_b, and the digital code determination unit 190_b of the calibration unit 140_b of FIG. 3A, respectively, and therefore, repeated descriptions thereof are not provided.

The resistance calculation unit 180_c may receive a voltage signal VS generated by the voltage measure unit 170_c. The resistance calculation unit 180_c may calculate a resistance value of the first duplicate switching unit 150_c. For example, the resistance calculation unit 180_c may calculate the resistance value through an intermediate value of a range of a voltage of a measuring node MN through the voltage signal VS received from the voltage measure unit 170_c. For example, when the intermediate value of the range of the voltage of the measuring node MN is 1.4 V, a current supplied by the first current source CS_1 is 0.25 mA, and a voltage supplied by a power source VDD is 1.5 V, the resistance value of the first duplicate switching unit 150_c may be calculated to be 400Ω. The resistance calculation unit 180_c may generate a resistance signal RS corresponding to the calculated size of the resistance value.

The digital code determination unit 190_c may receive the resistance signal RS generated by the resistance calculation unit 180_c. The digital code determination unit 190_c may determine a digital code through the resistance signal RS. The digital code determination unit 190_c may generate a digital code signal DCS based on the determined digital code.

Operations of the calibration unit 140_c will now be described in detail. When a first duplicate switch DSW_1 is closed by an external signal, for example, a calibration enable signal Cal_EN (Refer to FIG. 1), the first duplicate switching unit 150_c conducts a constant current generated by the first current source CS_1. Accordingly, a voltage drop is generated by a resistance value of the first duplicate switching unit 150_c. The resistance calculation unit 180_c may calculate the resistance value through the intermediate value of the range of the voltage of the measuring node MN through the voltage signal VS received from the voltage measure unit 170_c. The digital code determination unit 190_c may receive the resistance signal RS generated by the resistance calculation unit 180_c. The digital code determination unit 190_c may determine a digital code corresponding to the resistance signal RS. The digital code determination unit 190_c may generate the digital code signal DCS based on the determined digital code.

Figure 3C:
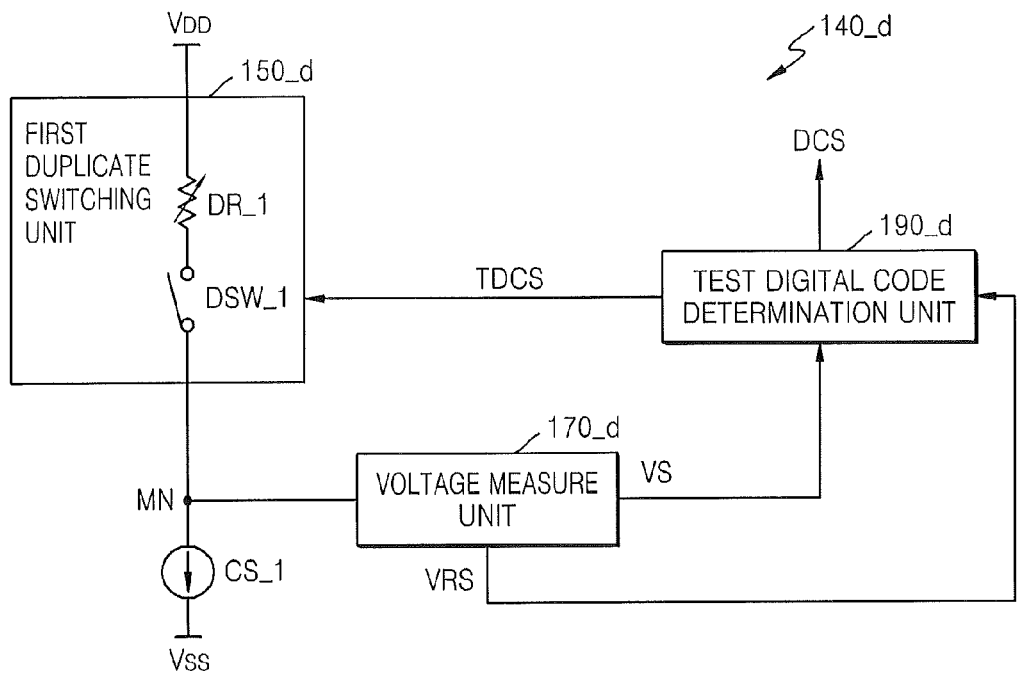
FIG. 3C is a circuit diagram illustrating a duplicate switching unit of a calibration unit included in a driver circuit according to further embodiments of the inventive subject matter.

FIG. 3C is a circuit diagram illustrating in detail a structure of a first duplicate switching unit 150_d of a calibration unit 140_d of a high-speed voltage mode driver, according to further embodiments of the inventive subject matter. The calibration unit 140_d includes the first duplicate switching unit 150_d, a first current source CS_1, a voltage measure unit 170_d, and a test digital code determination unit 190_d. The first current source CS_1 and the voltage measure unit 170_d of the calibration unit 140_d operate in a similar manner as the first current source CS_1 and the voltage measure unit 170_b of the calibration unit 140_b of FIG. 3A, respectively, and therefore, repeated descriptions thereof are not provided.

The test digital code determination unit 190_d may receive a voltage signal VS generated by the voltage measure unit 170_d. The test digital code determination unit 190_d may determine a test digital code based on the voltage signal VS. The test digital code determination unit 190_d may generate a test digital code signal TDCS based on the determined test digital code.

The first duplicate switching unit 150_d may receive the test digital code signal TDCS determined by the test digital code determination unit 190_d. The first duplicate switching unit 150_d may adjust a resistance value of a first duplicate variable resistor DR_1 based on the test digital code signal TDCS.

The voltage measure unit 170_d may measure a voltage of a measuring node MN due to a voltage drop generated by the adjusted resistance value of the first duplicate variable resistor DR_1. The voltage measure unit 170_d may determine whether a voltage between two terminals of the first duplicate switching unit 150_d is within a predetermined range through the adjustment of the resistance value of the first duplicate variable resistor DR_1. When it is determined that the voltage of the measuring node MN is within the predetermined range through the adjusted resistance value of the first duplicate variable resistor DR_1, the voltage measure unit 170_d may generate a verified signal VRS. The voltage measure unit 170_d may again generate the voltage signal VS when the voltage of the measuring node MN is not within the predetermined range by the adjusted resistance value of the first duplicate variable resistor DR_1. Accordingly, the test digital code determination unit 190_d may repeatedly generate the test digital code signal TDCS until the voltage between the two terminals of the first duplicate switching unit 150_d is within the predetermined range.

The test digital code determination unit 190_d may receive the verified signal VRS generated by the voltage measure unit 170_d. The test digital code determination unit 190_d may confirm the test digital code to be a digital code. The test digital code determination unit 190_d may generate a digital code signal DCS.

Figure 4:
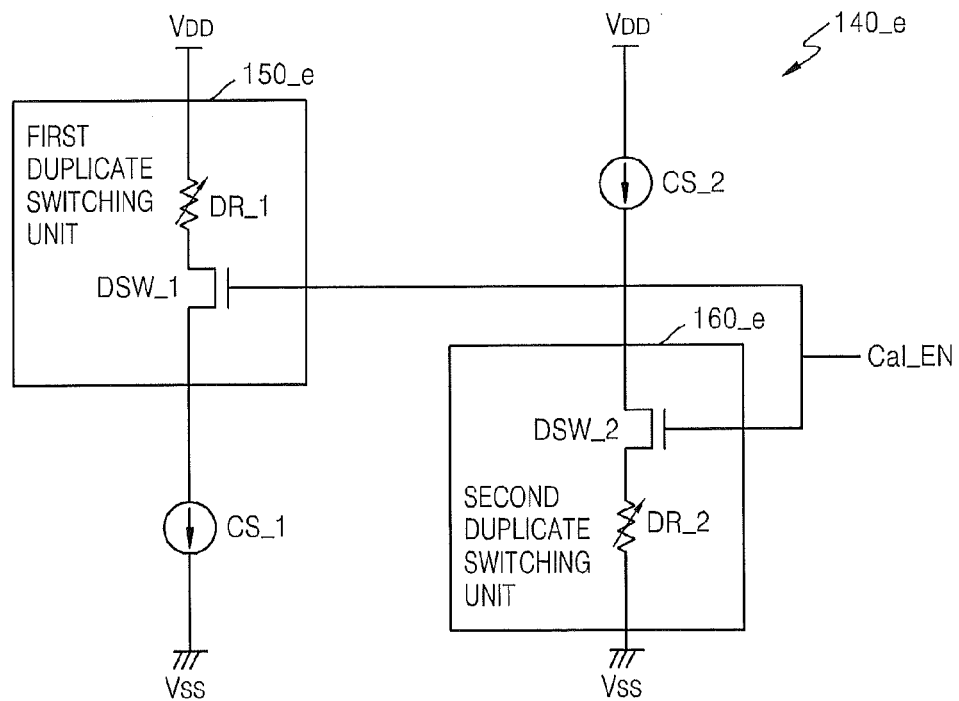
FIG. 4 is a circuit diagram illustrating a calibration unit of a driver circuit according to some embodiments of the inventive subject matter.

FIG. 4 is a circuit diagram illustrating in detail a calibration unit 140_e of a high-speed voltage mode driver, according to some embodiments of the inventive subject matter. The calibration unit 140_e includes a first duplicate switching unit 150_e, a first current source CS_1, a second duplicate switching unit 160_e, and a second current source CS_2. The first duplicate switching unit 150_e may include a first duplicate variable resistor DR_1 and a first duplicate switch DSW_1. The second duplicate switching unit 160_e may include a second duplicate variable resistor DR_2 and a second duplicate switch DSW_2.

The first and second duplicate switches DSW_1 and DSW_2 may be turned on by a calibration enable signal Cal_EN. In other words, the first and second duplicate switches DSW_1 and DSW_2 may be turned on by the calibration enable signal Cal_EN until the calibration unit 140_e generates a digital code signal. The first and second duplicate switches DSW_1 and DSW_2 may be turned off by the calibration enable signal Cal_EN after the calibration unit 140_e generates the digital code signal.

Accordingly, since the first duplicate switch DSW_1 has the same structure as the first switch SW_1, the first duplicate switch DSW_1 may function as a device having the same resistance value as the first switch SW_1 until the calibration unit 140_e generates the digital code signal. After the calibration unit 140_e generates the digital code signal, the first duplicate switch DSW_1 may block a current from being supplied from the first current source CS_1 to the first duplicate variable resistor DR_1 by the calibration enable signal Cal_EN, thereby preventing unnecessary power consumption.

Figure 5:
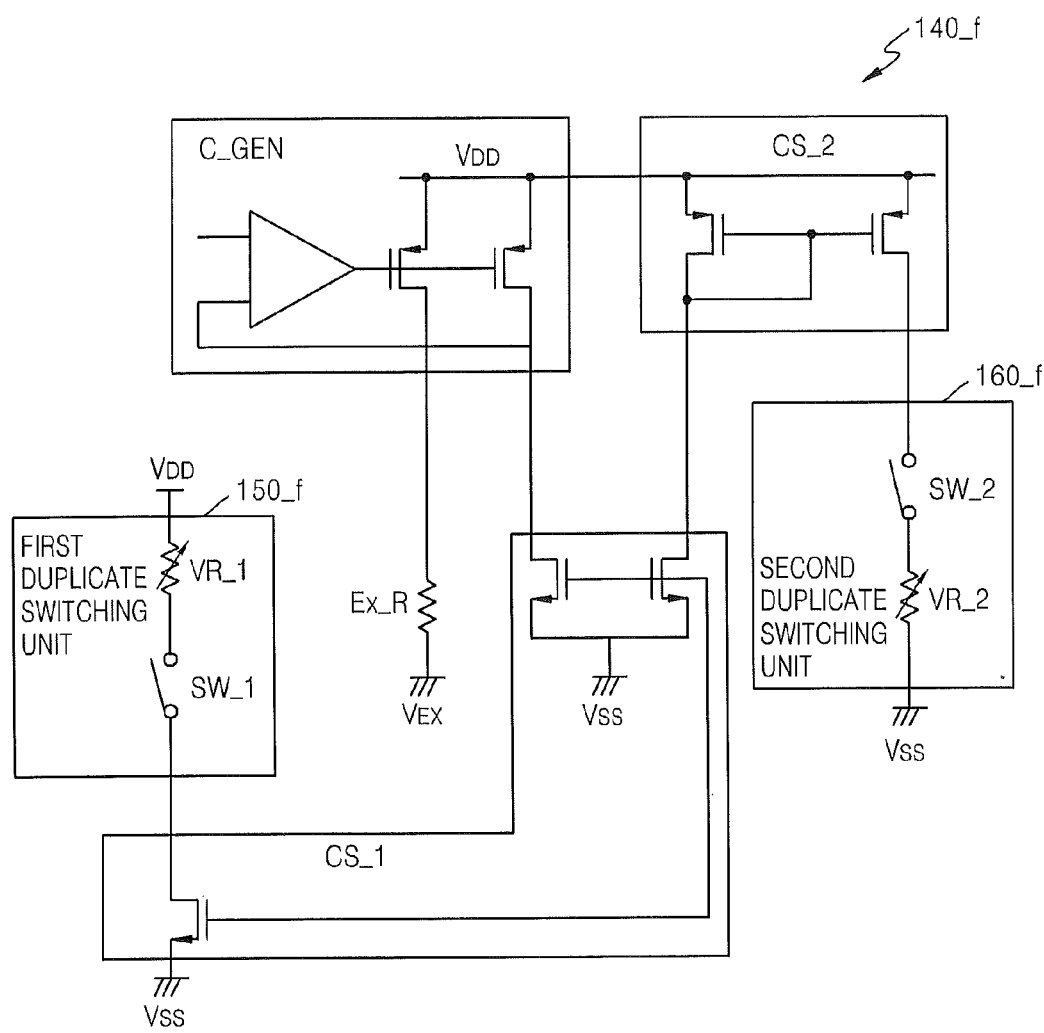
FIG. 5 is a circuit diagram illustrating a calibration unit of a driver circuit according to further embodiments of the inventive subject matter.

FIG. 5 is a circuit diagram illustrating in detail a calibration unit 140_f of a high-speed voltage mode driver, according to further embodiments of the inventive subject matter. The calibration unit 140_f includes a first duplicate switching unit 150f, a first current source CS_1, a second duplicate switching unit 160f, and a second current source CS_2. The first and second duplicate switching units 150_f and 160_f respectively operate in a similar manner as the first and second duplicate switching units 150 and 160 of FIG. 1.

The first and second current sources CS_1 and CS_2 may receive a signal indicating a current from a current generator C_GEN connected to an external resistor EX_R. The current generator C_GEN may be connected to the first and second current sources CS_1 and CS_2 such that the first and second current sources CS_1 and CS_2 supply a constant current. For example, the current generator C_GEN may enable the first and second current sources CS_1 and CS_2 to supply a constant current by being connected to the first and second current sources CS_1 and CS_2 via a current mirror. For example, the current generator C_GEN may be connected to the first current source CS_1 such that the first current source CS_1 supplies a constant current, and may be connected to the second current source CS_2 such that the second current source CS_2 supplies a constant current.

Figure 6A:
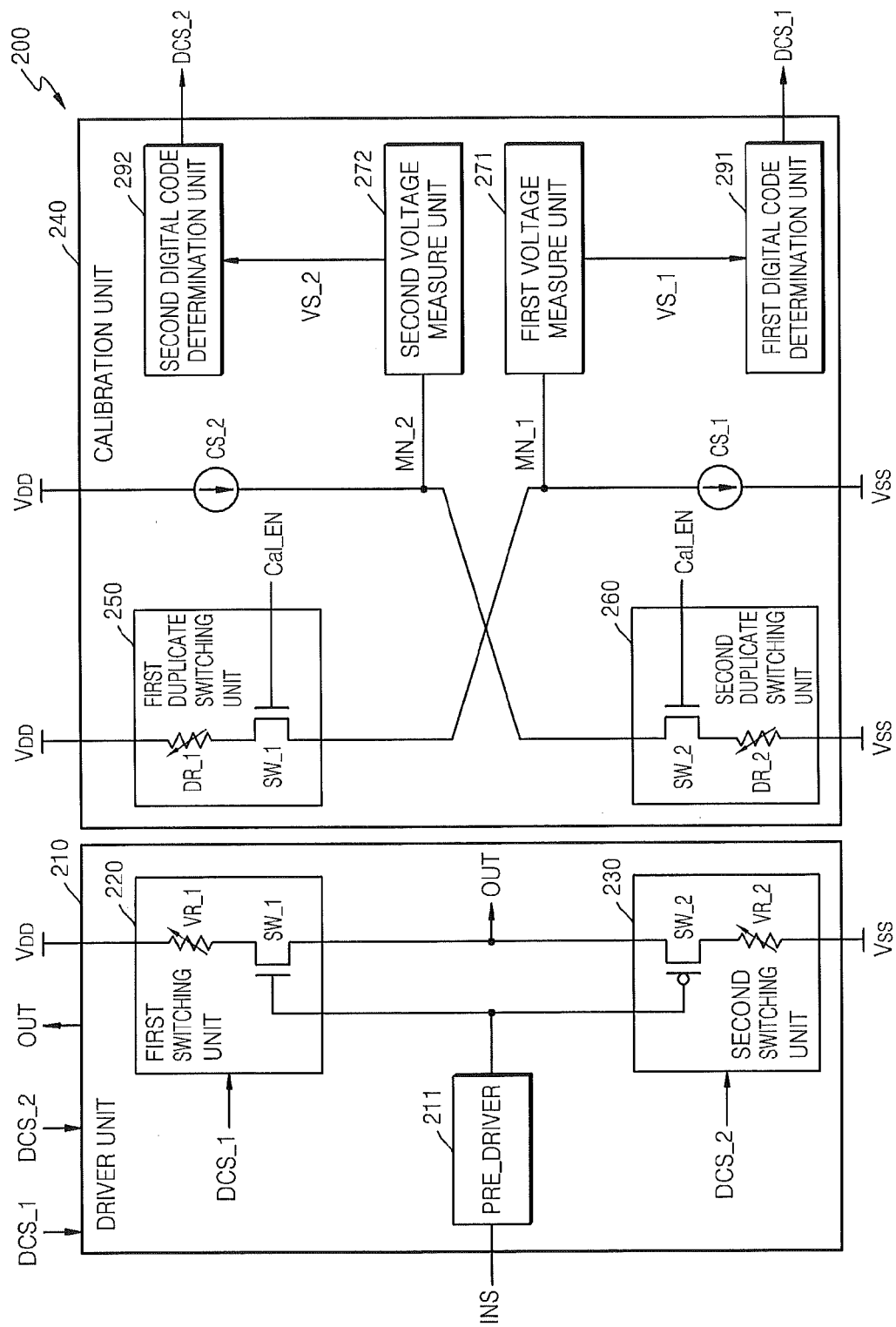
FIG. 6A is a circuit diagram illustrating a driver circuit according to further embodiments of the inventive subject matter.

FIG. 6A is a circuit diagram of a high-voltage voltage mode driver 200 according to further embodiments of the inventive subject matter. Referring to FIG. 6A, the high-speed voltage mode driver 200 includes a driver unit 210 and a calibration unit 240. The driver unit 210 operates in a similar manner to the driver unit 110 of FIG. 1, and therefore, repeated descriptions thereof are not provided.

The calibration unit 240 may include a first duplicate switching unit 250 and a second duplicate switching unit 260. The first duplicate switching unit 250 may be connected in series with a first current source CS_1. The second duplicate switching unit 260 may be connected in series with a second current source CS_2. The calibration unit 240 includes a first voltage measure unit 271, a first digital code determination unit 291, a second voltage measure unit 272, and a second digital code determination unit 292.

Operations of the high-speed voltage mode driver 200 will now be described in detail. When a first duplicate switch DSW_1 is closed by a calibration enable signal Cal_EN, the first duplicate switching unit 250 is conducted by a constant current by the first current source CS_1. Accordingly, a voltage drop is generated between two terminals of the first duplicate switching unit 250 by resistance values of the first duplicate switching unit 250. The first voltage measure unit 271 may measure a voltage of a first measuring node MN__1 so as to generate a first voltage signal VS__1 corresponding to the voltage of the first measuring node MN__1. The first digital code determination unit 291 may receive the first voltage signal VS__1 generated by the first voltage measure unit 271. The first digital code determination unit 291 may determine a first digital code based on the first voltage signal VS__1. The first digital code determination unit 291 may generate a first digital code signal DCS__1 based on the determined first digital code.

The second digital code determination unit 292 may generate a second digital code signal DCS__2 based on a determined second digital code. In other words, when a second duplicate switch DSW__2 is closed by the calibration enable signal Cal_EN, the second duplicate switching unit 260 conducts a constant current generated by the second current source CS__2. Accordingly, a voltage drop is generated between two terminals of the second duplicate switching unit 260 by resistance values of the second duplicate switching unit 260. The second voltage measure unit 272 may measure a voltage of a second measuring node MN__2 and generate a second voltage signal VS__2 corresponding to the voltage of the second measuring node MN__2. The second digital code determination unit 292 may receive the second voltage signal VS__2 generated by the second voltage measure unit 272. The second digital code determination unit 292 may determine a second digital code based on the second voltage signal VS__2. The second digital code determination unit 292 may generate the second digital code signal DCS__2 based on the determined second digital code.

The first and second digital code signals DCS__1 and DCS__2 may be simultaneously generated and stored in a buffer. After the first and second digital code signals DCS__1 and DCS__2 are generated, the first and second duplicate switches DSW__1 and DSW__2 may be opened by the calibration enable signal Cal_EN. Accordingly, power consumption may be reduced.

Figure 6B:
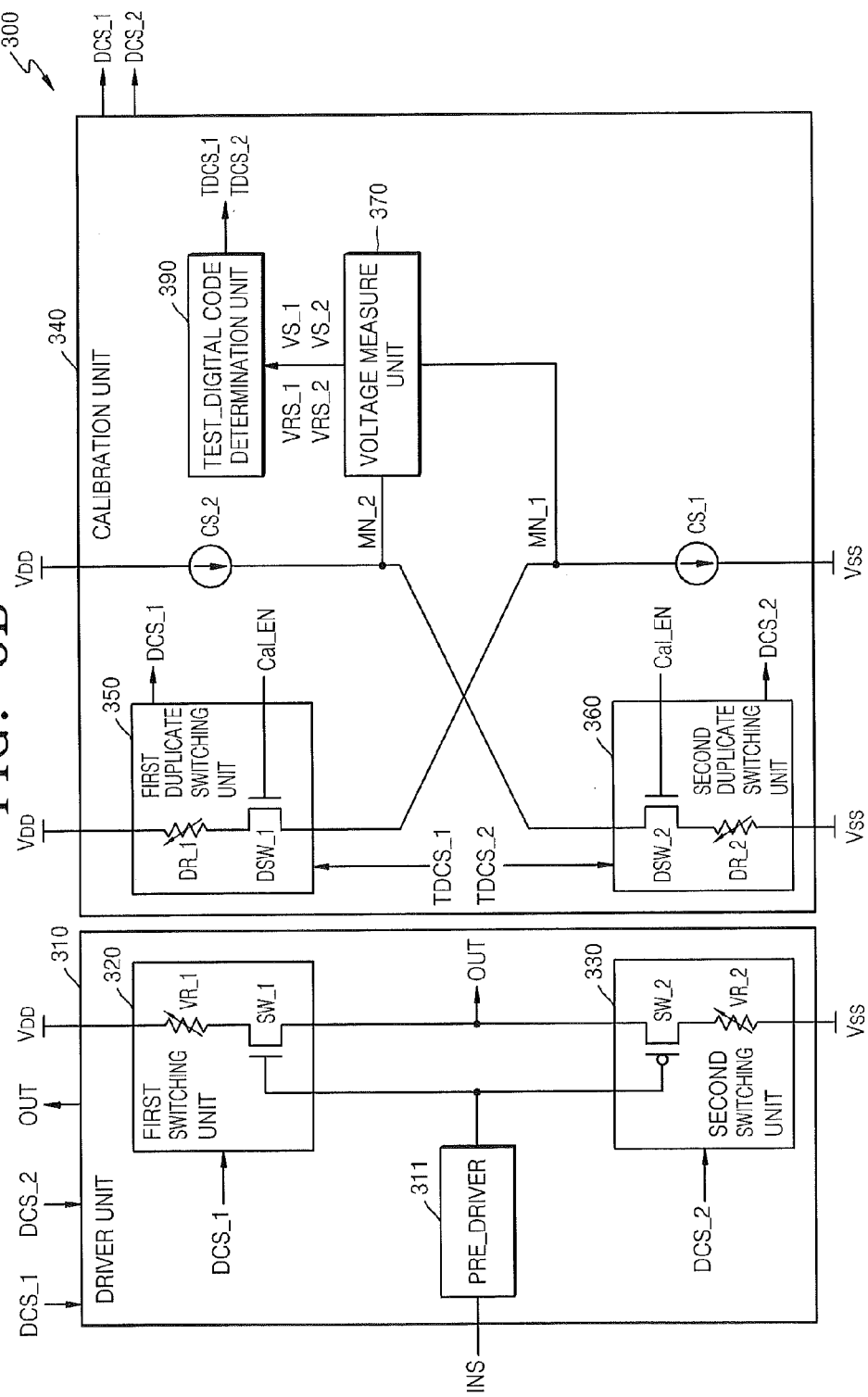
FIG. 6B is a circuit diagram illustrating a driver circuit according to further embodiments of the inventive subject matter.

FIG. 6B is a circuit diagram of a high-speed voltage mode driver 300 according to further embodiments of the inventive subject matter. Referring to FIG. 6A, the high-speed voltage mode driver 300 includes a driver unit 310 and a calibration unit 340. The driver unit 310 operates in a similar manner as the driver unit 110 of FIG. 1, and therefore, repeated descriptions thereof are not provided.

The calibration unit 340 may include a first duplicate switching unit 350 and a second duplicate switching unit 360. The first duplicate switching unit 350 may be connected in series with a first current source CS__1. The second duplicate switching unit 360 may be connected in series with a second current source CS__2. The calibration unit 340 includes a voltage measure unit 370 and a test digital code determination unit 390.

Operations of the high-speed voltage mode driver 300 will now be described in detail. When a first duplicate switch DSW__1 is closed by a calibration enable signal Cal_EN, the first duplicate switching unit 350 is conducted by a constant current by the first current source CS__1. Accordingly, a voltage drop is generated between two terminals of the first duplicate switching unit 350 by resistance values of the first duplicate switching unit 350. The voltage measure unit 370 may measure a voltage of a first measuring node MN__1 and generate a first voltage signal VS__1 corresponding to the voltage of the first measuring node MN__1. The test digital code determination unit 390 may receive the first voltage signal VS__1 generated by the voltage measure unit 370. The test digital code determination unit 390 may determine a test digital code TDC based on the first voltage signal VS__1. The test digital code determination unit 390 may generate a test digital code signal TDCS based on the determined test digital code TDC.

The first and second duplicate switching units 350 and 360 may receive the test digital code signal TDCS. The first duplicate switching unit 350 may adjust a resistance of a first duplicate variable resistor DR__1 upon receiving a first test digital code signal TDCS__1. The voltage measure unit 370 may generate a first verified signal VRS__1 when a voltage of two terminals of the first duplicate switching unit 350 is within a predetermined range. The test digital code determination unit 390 may verify a first test digital code TDC__1 as a first digital code CD__1 by receiving the first verified signal VRS__1. If the voltage of two terminals of the first duplicate switching unit 350 is not within the predetermined range, the test digital code determination unit 390 may repeatedly generate the first test digital code signal TDCS__1 until the voltage of the two terminals of the first duplicate switching unit 350 is within the predetermined range.

Similarly, the second duplicate switching unit 360 may adjust a resistance value of a second duplicate variable resistor DR__2 based on a received second test digital code signal TDCS__2 generated by the test digital code determination unit 390. When a voltage of two terminals of the second duplicate switching unit 360 is within a predetermined range, the voltage measure unit 370 may generate a second verified signal VRS__2. The test digital code determination unit 390 may verify a second test digital code TDC__2 as a second digital code DC__2 by receiving the second verified signal VRS__2. If the voltage of the two terminals of the second duplicate switching unit 360 is not within the predetermined range, the test digital code determination unit 390 may repeatedly generate the second test digital code signal TDCS__2 until the voltage of the two terminals of the second duplicate switching unit 360 is within the predetermined range.

Figure 7:
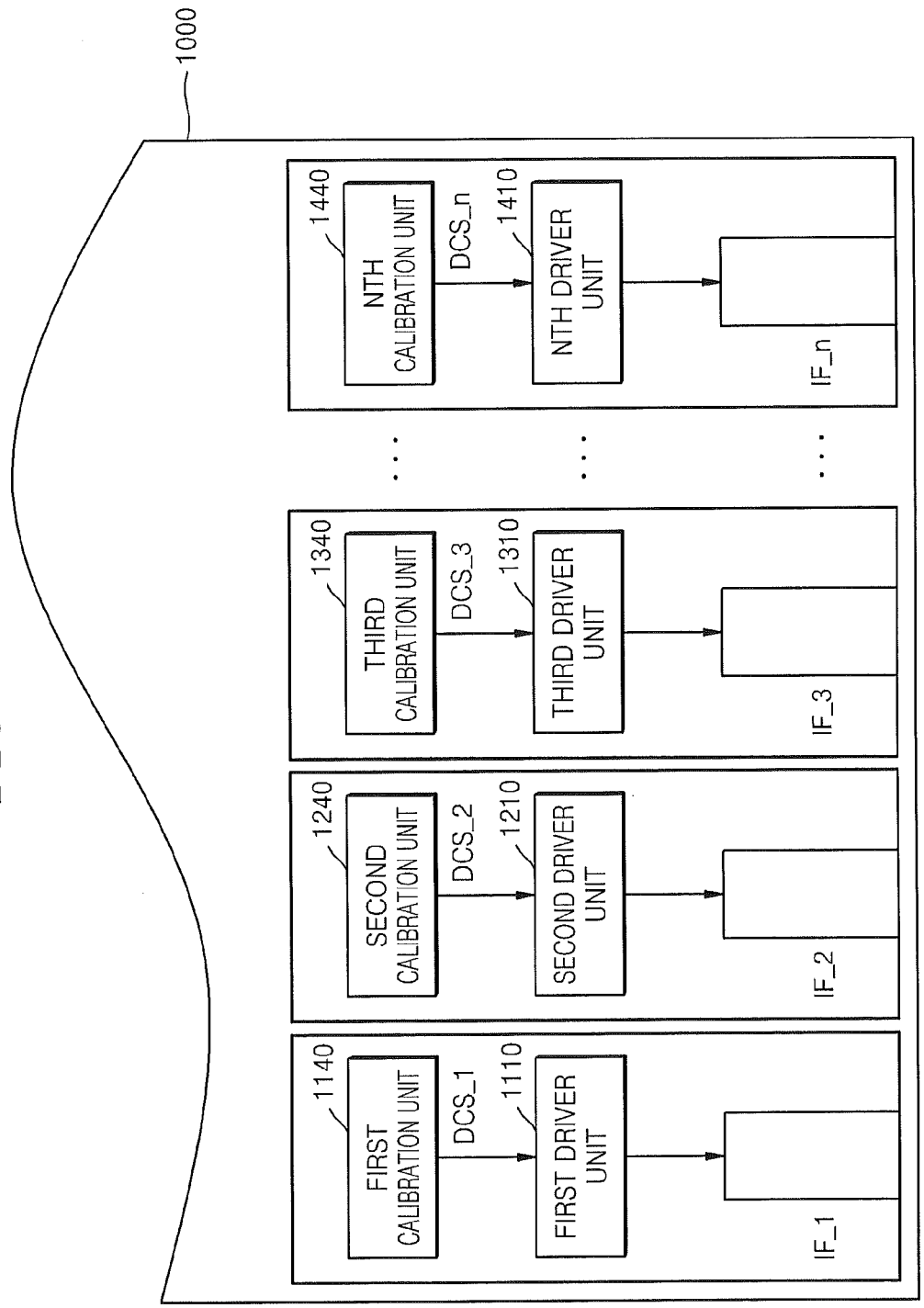
FIG. 7 is a circuit diagram illustrating a memory system including a driver circuit according to some embodiments of the inventive subject matter.

FIG. 7 is a circuit diagram of a memory system 1000 including a voltage mode driver, according to some embodiments of the inventive subject matter. Referring to FIG. 7, the memory system 1000 may include a plurality of interface units IF__1 through IF_n and a semiconductor memory device (not shown). The interface units IF__1 through IF_n may provide an interface between the memory system 1000 and a host (not shown). The interface units IF__1 through IF_n may include a data exchange protocol corresponding to the host to interface with the host. The interface units IF__1 through IF_n may be configured to communicate with the host through one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), and integrated drive electronics (IDE). The interface units IF__1 through IF_n may respectively include first through nth driver units 1110 through 1410 and first through nth calibration units 1140 through 1440. Each of the first through nth driver units 1110 through 1410 may operate in a similar manner to the driver unit 110 of FIG. 1. Each of the first through nth calibration units 1140 through 1440 may operate in a similar manner to the calibration unit 140 of FIG. 1.

While the inventive subject matter has been particularly shown and described with reference to exemplary embodiments thereof, it will be understood that various changes in form and details may be made therein without departing from the spirit and scope of the following claims.

What is claimed is:

1. A semiconductor device comprising:
a driver circuit comprising:
a first variable resistor and having a resistance configured to be adjusted responsive to a resistance control signal; and
a first switch, connected in series with the first variable resistor and configured to couple an output node to a power supply node via the first variable resistor responsive to an input signal;
a second variable resistor; and
a control circuit configured to generate a voltage across the second variable resistor and to generate the resistance control signal responsive to the generated voltage, wherein the control circuit comprises:
a current source circuit;
a second switch coupled in series with the second variable resistor and configured to couple the current source circuit to a power supply node via the second variable resistor; and
a digital code generation circuit configured to sense a voltage at a terminal of the second switch and to generate a digital code signal responsive to the sensed voltage.

2. The device of claim 1, wherein the second variable resistor is a duplicate of the first variable resistor.

3. The device of claim 2, wherein the first and second variable resistors are disposed on a common substrate.

4. The device of claim 3, wherein the second variable resistor is a duplicate of the first variable resistor and wherein the second switch is a duplicate of the first switch.

5. The device of claim 4, wherein the first variable resistor, the first switch, the second variable resistor and the second switch are disposed on a common substrate.

6. The device of claim 3, wherein the current source circuit comprises a current mirror circuit.

7. The device of claim 3, wherein the digital code generation circuit is configured to adjust the second variable resistor to cause the sensed voltage at the terminal of the second switch to meet a predetermined criterion and to generate the digital code signal based responsive to adjustment of the second variable resistor.

8. The device of claim 3, wherein the control circuit is configured to open the second switch to prevent current flow through the second variable resistor responsive to generation of the digital code signal.

9. The device of claim 1, wherein the first variable resistor comprises:
a fixed resistor; and
a resistance control circuit coupled in parallel with the fixed resistor and adjustable responsive to the resistance control signal.

10. The device of claim 9, wherein the resistance control circuit comprises:
a plurality of resistors; and
a switching circuit configured to selectively couple the plurality of resistors in parallel with the fixed resistor responsive to the resistance control signal.

11. A semiconductor device comprising:
a driver circuit comprising:
a first variable resistor having a resistance configured to be adjusted responsive to a first resistance control signal;
a first switch connected in series with the first variable resistor and configured to couple an output node to a first power supply node via the first variable resistor responsive to an input signal;
a second variable resistor having a resistance configured to be adjusted responsive to a second resistance control signal; and
a second switch connected in series with the second variable resistor and configured to couple the output node to a second power supply node via the second variable resistor responsive to the input signal; and
a calibration circuit comprising:
a third variable resistor that is a duplicate of the first variable resistor;
a fourth variable resistor that is a duplicate of the second variable resistor; and
a control circuit configured to generate respective ones of the first and second resistance control signals responsive to voltages across respective ones of the third and fourth variable resistors, wherein the control circuit comprises:
a first current source circuit;
a second current source circuit;
a third switch coupled in series with the third variable resistor and configured to couple the first current source circuit to the first power supply node via the third variable resistor;
a fourth switch coupled in series with the fourth variable resistor and configured to couple the second current source circuit to the second power supply node via the fourth variable resistor; and
a digital code generation circuit configured to sense respective voltages at respective terminals of the third and fourth switches and to generate respective one of the first and second digital resistance control signals responsive to the sensed voltages.

12. A semiconductor device comprising:
a driver circuit having an output resistance that is controllable responsive to a resistance control signal, wherein the driver circuit comprises a first variable resistor and is configured to couple an output node to a power supply node via the first variable resistor responsive to an input signal, wherein the first variable resistor comprises:
a fixed resistor;
a plurality of resistors; and
a switching circuit configured to selectively couple the plurality of resistors in parallel with the fixed resistor responsive to the resistance control signal; and
a calibration circuit configured to duplicate a resistance behavior of the driver circuit and to generate the resistance control signal responsive to the duplicated resistance behavior, wherein the calibration circuit comprises a second variable resistor that is a duplicate of the first variable resistor.

13. The device of claim 12, wherein the calibration circuit further comprises a current source circuit and is configured to couple the second variable resistor between the power supply node and the current source circuit and to generate the resistance control signal responsive to a voltage of the second variable resistor.

14. The device of claim 13:
wherein the driver circuit comprises a first switch configured to couple the first variable resistor between the power supply node and the output node; and
wherein the calibration circuit comprises a second switch that is a duplicate of the first switch and that is configured to couple the second variable resistor between the power supply node and the current source circuit.

15. The device of claim 14, wherein the calibration circuit is configured to generate the resistance control signal responsive to a voltage at a terminal of the second switch.

16. The device of claim 12, wherein the first and second variable resistors are disposed on a common substrate.

* * * * *